United States Patent
Aporius et al.

(10) Patent No.: US 10,141,859 B2
(45) Date of Patent: Nov. 27, 2018

(54) SERIES MODULE ASSEMBLY WITH A POWER BUS SYSTEM

(71) Applicant: Weidmüller Interface GmbH & Co. KG, Detmold (DE)

(72) Inventors: Stefan Aporius, Detmold (DE); Wolfgang Sichmann, Hüttenberg (DE)

(73) Assignee: Weidmüller Interface GmbH & Co. KG (DE)

( * ) Notice: Subject to any disclaimer, the term of this patent is extended or adjusted under 35 U.S.C. 154(b) by 0 days.

(21) Appl. No.: 15/409,616

(22) Filed: Jan. 19, 2017

(65) Prior Publication Data

US 2017/0288563 A1    Oct. 5, 2017

(30) Foreign Application Priority Data

Jan. 22, 2016    (DE) .................... 20 2016 100 307 U

(51) Int. Cl.
| | |
|---|---|
| H05K 7/14 | (2006.01) |
| H02B 1/40 | (2006.01) |
| H02M 7/00 | (2006.01) |
| H01R 9/26 | (2006.01) |
| H01R 25/00 | (2006.01) |

(52) U.S. Cl.
CPC .......... *H02M 7/003* (2013.01); *H01R 9/2675* (2013.01); *H01R 25/006* (2013.01); *H02B 1/40* (2013.01); *H05K 7/1432* (2013.01)

(58) Field of Classification Search
None
See application file for complete search history.

(56) References Cited

U.S. PATENT DOCUMENTS

| | | | | |
|---|---|---|---|---|
| 5,510,960 A | * | 4/1996 | Rosen .................. | H01R 9/2425 361/624 |
| 5,989,073 A | * | 11/1999 | Kahoun ............... | H01R 9/2491 439/651 |
| 6,172,877 B1 | * | 1/2001 | Feye-Hohmann ...... | G06F 1/184 361/728 |
| 6,603,075 B1 | * | 8/2003 | Soares .................... | H02B 1/21 174/149 B |

(Continued)

FOREIGN PATENT DOCUMENTS

| | | |
|---|---|---|
| DE | 100003349 B4 | 8/2001 |
| DE | 202013104785 U1 | 1/2014 |

*Primary Examiner* — Courtney Smith
(74) *Attorney, Agent, or Firm* — Laubscher & Laubscher, P.C.

(57) ABSTRACT

A series module assembly particularly for drive technology includes a bus system and series modules arranged in side by side in a row on a mounting base. The series modules each have an electronics housing in which at least one electronic element is arranged. The bus system includes busbars that extend outside of the electronics housing, wherein at least one of the busbars can be electrically connected to the electronic element of one of the series modules via a plug assembly. The series module assembly is designed for wall mounting. The bus bars are pre-assembled with a mounting and bus rail and anchored to the wall. The mounting and bus rail is configured so that the series modules can be mounted on the mounting and bus rail in a direction parallel to the wall in order to establish contact with the busbars. The mounting and bus rail can be adjustably mounted at a selected distance from the wall.

13 Claims, 4 Drawing Sheets

(56) References Cited

U.S. PATENT DOCUMENTS

| | | | |
|---|---|---|---|
| 6,870,103 B1* | 3/2005 | Wiant | H02G 5/007 |
| | | | 174/68.2 |
| 7,408,766 B2* | 8/2008 | Oesterhaus | H01R 9/22 |
| | | | 361/624 |
| 7,520,776 B2* | 4/2009 | Wagener | H02B 1/21 |
| | | | 439/532 |
| 9,263,861 B2* | 2/2016 | Schumacher | H01R 9/2608 |
| 2004/0024939 A1* | 2/2004 | Hoeing | H05K 7/1472 |
| | | | 710/300 |
| 2013/0045613 A1* | 2/2013 | Griese | H01R 9/2658 |
| | | | 439/121 |
| 2014/0045353 A1* | 2/2014 | Balcerak | H01R 13/514 |
| | | | 439/136 |
| 2015/0333423 A1* | 11/2015 | Busch | H05K 7/1469 |
| | | | 439/78 |

\* cited by examiner

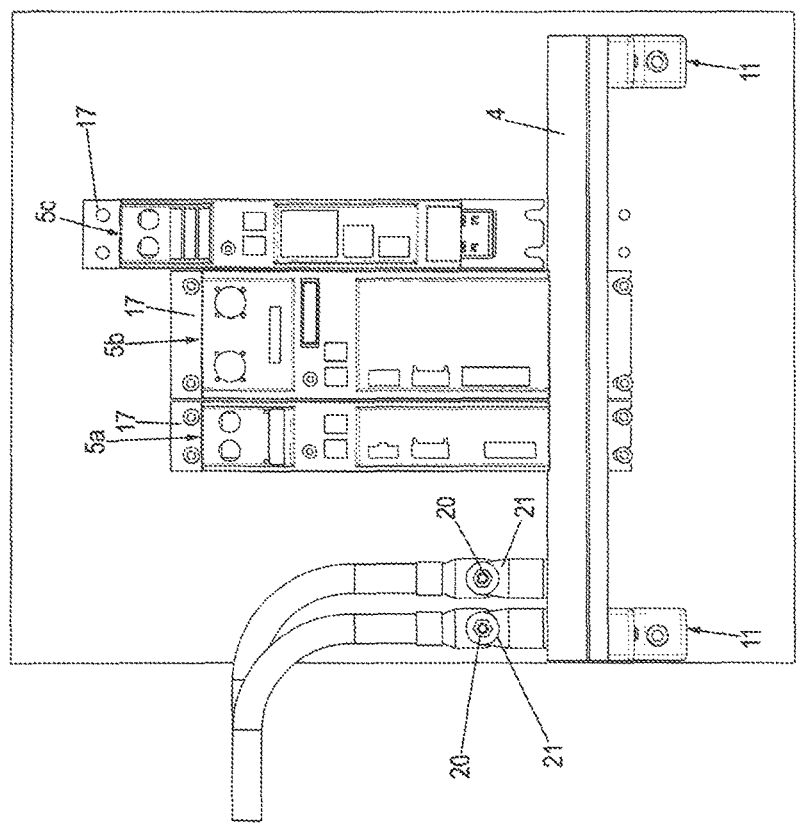

SERIES MODULE ASSEMBLY WITH A POWER BUS SYSTEM

This application claims priority of German Patent Application No. DE 202016100307.5 filed Jan. 22, 2016. The entire content of these applications are incorporated herein by reference.

BACKGROUND OF THE INVENTION

The invention relates to a series module assembly, in particular for drive technology, including a bus system and series modules which are arranged in a given row direction on a mounting base, with each of the series modules having an electronics housing in which at least one electronic element is arranged. The bus system further includes busbars that extend outside of the electronics housing. At least one of the busbars is electrically connected via a plug assembly to the electronic element of one of the series modules. The series module assembly is designed for wall mounting, for which purpose the busbars are attached to the wall preassembled with a mounting device and a bus rail.

BRIEF DESCRIPTION OF THE PRIOR ART

A series module assembly of this type is known from FIG. 5 of DE 20 21 013 104 785. Such series module assemblies having a bus system are required in drive technology, for example, to ensure the supply of electric power to electrical components and if necessary to transmit electrical signals for the components. Electrical components of this type are electrical devices that can be connected to such a bus system. These include electrical devices that ensure a supply of electric power, for example mains units, frequency converters and the like. Such bus systems are preferably routed outside of the electrical components in order to facilitate access to the bus system and to enable tapping of the electric power supply and the electrical signals at any point along the bus system.

SUMMARY OF THE INVENTION

According to the invention, series modules are mounted on the mounting and bus rail, particularly in only one mounting direction parallel to the wall, in order to establish contact with the busbars. In addition, the mounting and bus rail is mounted spaced from the wall, with the distance preferably being adjustable.

This mounting facilitates supplemental mechanical securing of the series modules preferably directly onto the wall, so that the mounting and bus rail is not responsible or not solely responsible for this mechanical fastening. The mounting and bus rail is used primarily for power transmission and optionally for signals or data transmission. Like a generic series module assembly, the inventive series module assembly can also be used in drive technology to ensure the supply of electric power to electrical components that are connected to the series modules and, if necessary, to transmit electrical signals.

In terms of structure, it is simple and advantageous according to one embodiment for the mounting and bus rail to have a base profile made of an insulating material in which busbars are anchored. Preferably, the base profile is U-shaped in cross-section with one base limb and two longitudinal limbs perpendicular thereto to define a contact space between the base limb and the longitudinal limbs in which two or more busbars are arranged.

The busbars of the mounting and bus rail are contacted via plug assemblies which are formed on the series modules.

The busbars preferably extend over the entire length of the mounting and bus rail, or over the area between the anchoring assemblies, enabling a stepless arrangement of the series modules on the mounting and bus rail.

According to a further embodiment, the mounting and bus rail is secured to the wall using one or more anchoring assemblies. In this connection, two of the anchoring assemblies are provided at the two ends of the mounting and bus rail with the series modules arranged between the two anchoring assemblies.

According to a preferred embodiment, the anchoring assemblies are designed such that they can be used to adjust the distance between the mounting and bus rail and the wall, so that a gap may be formed between the wall and the mounting and bus rail. This also allows the series modules to be secured directly to the wall. For this purpose, the series modules extend through the gap with at least one mounting bracket which is secured directly to the wall.

In terms of structure, each of the anchoring assemblies includes an angle bracket having a first anchoring arm and a second anchoring arm aligned perpendicular to the first, wherein the first anchoring arm is secured to the wall and the mounting and bus rail is secured to the second anchoring arm.

According to a preferred embodiment, the mounting and bus rail is secured to the second anchoring arm, spaced from the wall.

The electric power and, if desired, the signals can be supplied in various ways, for example with the aid of one or more cable terminals that are screw-connected to a respective connecting lug, which is/are formed on the mounting and bus rail and which is/are each conductively connected to one or more of the busbars.

Finally, according to a further embodiment, open spaces on the sides of the series modules or between series modules that are attached to the mounting and bus rail are covered by one or more covers.

BRIEF DESCRIPTION OF THE FIGURES

Other objects and advantages of the invention will become apparent from a study of the following description when viewed in the light of the accompanying drawing, in which:

FIG. 1b is a side view of the assembly of FIG. 1a;

FIG. 2 a front view illustrating a second embodiment of a wall mounting of a series module assembly;

FIG. 3b is a side view of the assembly of FIG. 3a;

DETAILED DESCRIPTION

Figure 1B:
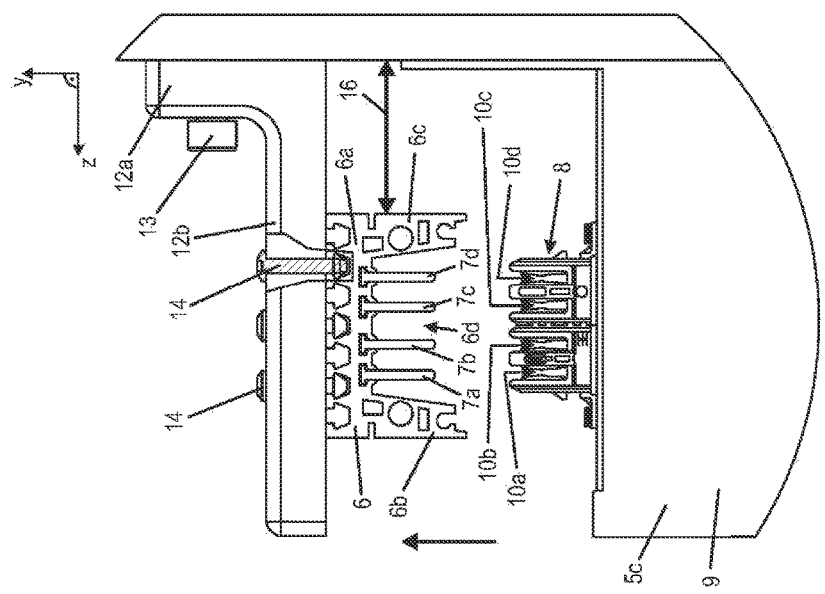
Figure 1A:
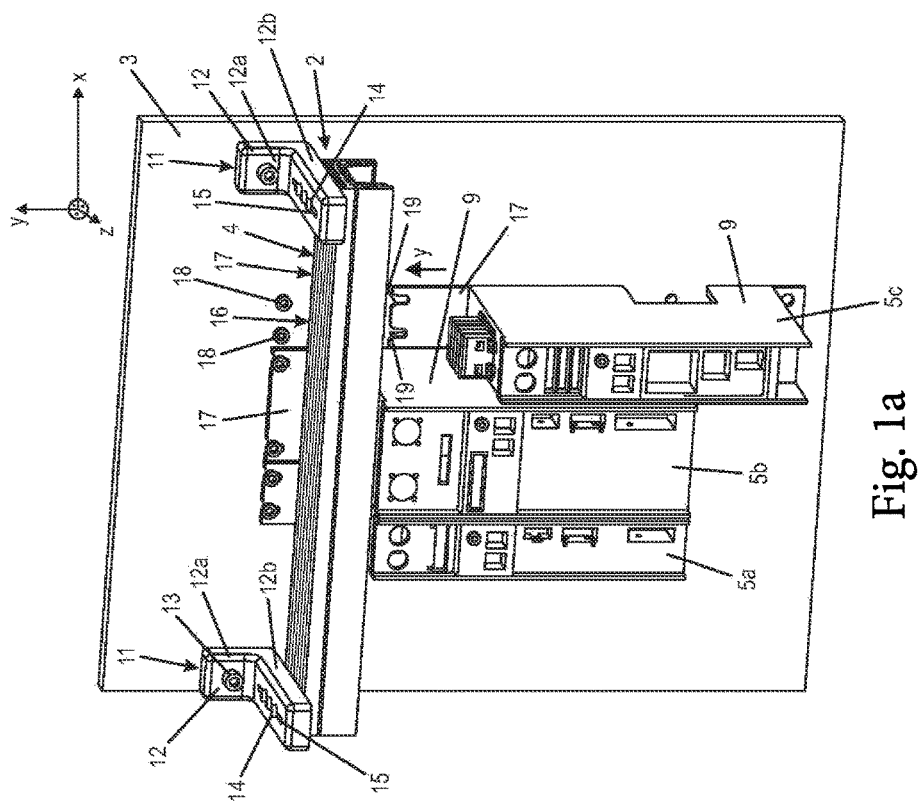
FIG. 1a is a perspective view illustrating one embodiment of a wall mounting of a series module assembly.
Figure 3A:
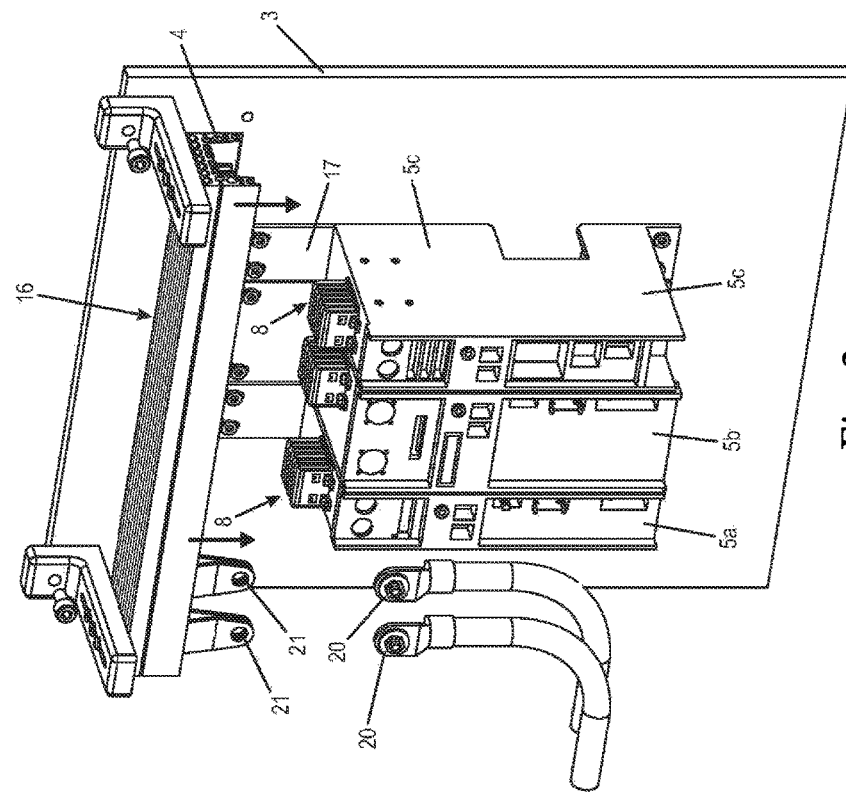
FIG. 3a is a perspective view illustrating a further embodiment of a wall mounting of a series module assembly.
Figure 3C:
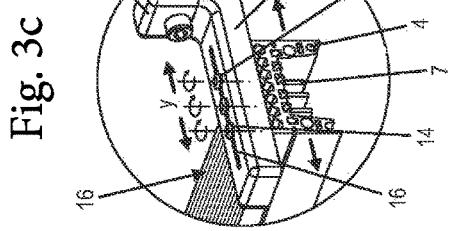
FIG. 3c is a perspective view of part of the assembly of FIG. 13a in a later mounting stage.
Figure 3B:
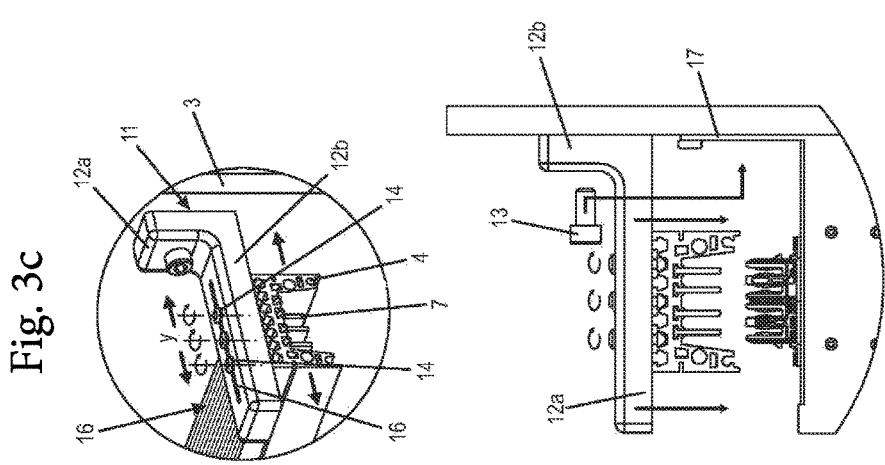

FIG. 1a is a perspective view of a series module assembly 1 having a plurality of series modules 5 arranged in a row and mounted in a given row direction X on a mounting base 2. Mounting base 2 has a mounting and bus rail 4 anchored to a wall 3. Wall 3 extends in an X/Y plane. The direction perpendicular to wall 3 is denoted by Z. Together, "X", "Y" and "Z" define a Cartesian system of coordinates.

In the example shown, three series modules 5a, 5b, 5c arranged in a row are shown, purely by way of example. The number of series modules that can be arranged in a row is dependent geometrically upon the width of the modules and the length of the mounting and bus rail 4 in row direction X, among other factors.

Mounting and bus rail 4 is configured such that series modules 5 can be attached to the mounting and bus rail 4 in direction Y, which is aligned parallel to the wall and perpendicular to row direction X.

As shown more particularly in FIG. 1b, the mounting and bus rail 4 has a base profile 6 made of a non-conductive insulating material. This base profile 6 preferably is U-shaped in cross-section with one base limb 6a and two longitudinal limbs 6b, 6c perpendicular thereto. Between the base limb 6a and the longitudinal limbs 6b, 6c, a contact space 6d is formed. Two or more busbars made of a conductive material, in particular a conductive metal, are arranged within this contact space 6d. In the embodiment shown, four busbars 7a-7d are shown, although other numbers of busbars may be provided. These busbars are anchored in the base profile 6, in particular in the base limb 6a thereof. These busbars 7a-7d extend within the X/Y plane. They are aligned parallel to one another. Their main direction of extension is row direction X. Busbars 7 preferably extend continuously over the entire length of the base profile so that they can be used to establish a conductive connection between the series modules 5 that are attached to mounting and bus rail 4. When mounted, base limb 6a extends preferably perpendicular to wall 3. In contrast, longitudinal limbs 6b and 6c extend parallel to the wall.

Figure 4A:
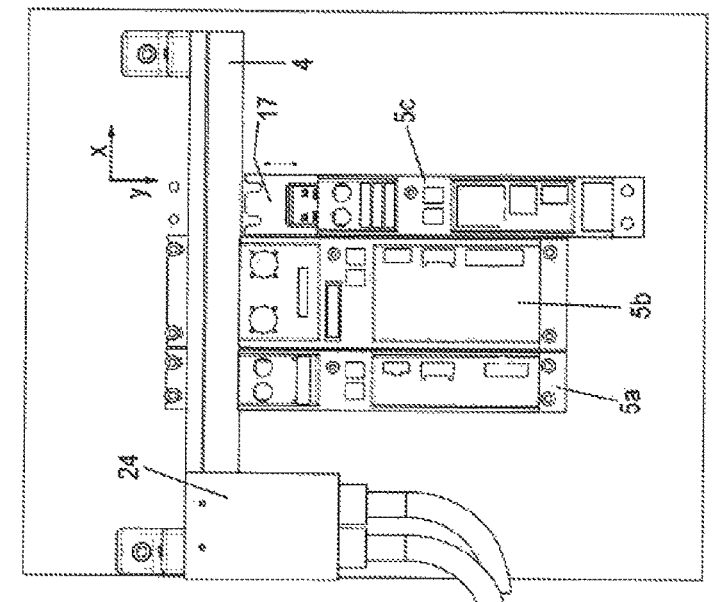
FIGS. 4a and b are perspective and side views, respectively, of an assembly of the type shown in FIG. 1a in later mounting stages.
Figure 4B:
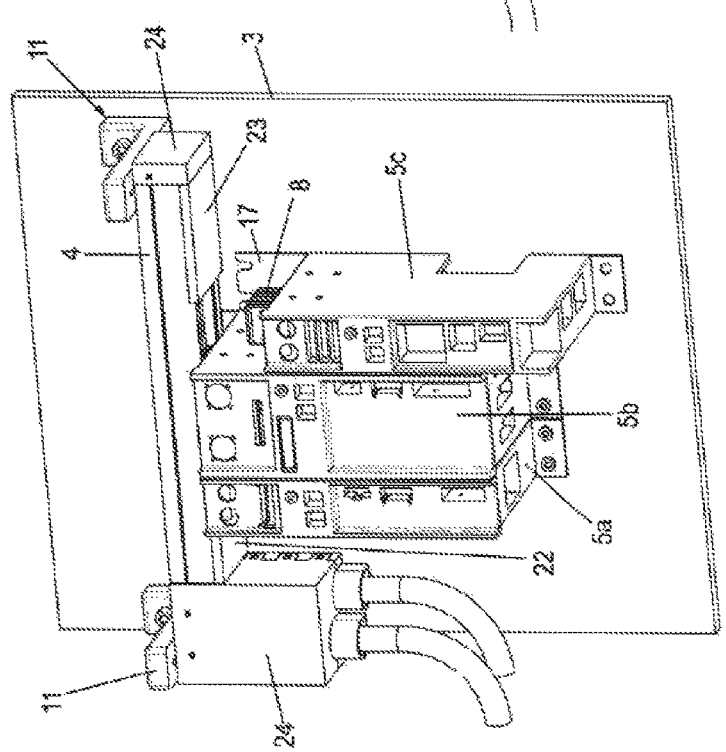

Contact can be established between busbars 7 and plug assemblies 8 which are formed on series modules 5a-5d. These plug assemblies 8 may be configured in the manner shown in FIG. 4 or 5 of DE 20 2013 104 785 U1. Plug assemblies 8 are used for conductively connecting busbars 7 to an electronic element such as an electronic circuit board within an electronics housing 9 of the series modules 5. Plug assemblies 8 include one or more contact clusters 10a-10d each for receiving and contacting one of the busbars 7, respectively. One or more of the contact clusters 10a-10d may each form part of a multiple contact spring, in particular an S-shaped or W-shaped spring, which is connected directly or via at least one additional conductive element to the circuit board as shown for example in FIGS. 1 to 5 of DE 20 2013 104 785 U1.

Mounting and bus rail 4 is secured to the wall by one or more anchoring assemblies 11. According to each of FIGS. 1 to 4, two anchoring assemblies 11 are provided, one at each of the two ends of the mounting and bus rail 4. Series modules 5a-5c are then provided between these two anchoring assemblies 11 and attached to the mounting and bus rail 4.

The anchoring assemblies 11 each include an angle bracket 12 having a first anchoring arm 12a and a second anchoring arm 12b extending perpendicular to the first arm. The first anchoring arm 12a is aligned parallel to and rests against wall 3 and is secured thereto with at least one first anchoring device 13. In this case, this first anchoring device 13 is a screw. The second anchoring arm 12b is aligned perpendicular to wall 3. Base limb 6a of base profile 6 of the mounting and bus rail 4 rests against the second anchoring arm. Base limb 6a is in turn secured to the second anchoring arm 12b by at least one second anchoring device 14 such as a screw. Preferably, a plurality of screws are provided as the second anchoring devices 14.

According to a preferred embodiment, the distance between the mounting and bus rail 4 and the wall 3 is adjustable. For this purpose, the anchoring screws 14 preferably pass through at least one elongated slot or hole 15 extending in the Z-direction in the second anchoring arm 12b. The elongated hole 15 is dimensioned in the Z-direction perpendicular to wall 3 such that the mounting and bus rail 4 can be displaced to a limited extent perpendicular to wall 3 before the screws are tightened. This allows a gap 16 or a distance between the mounting and bus rail 4 and the wall 3 to be adjusted as shown in FIG. 1b.

A mounting arm 17 on the housings 9 of the series modules 5 can extend through the adjusted gap 16 so that the mounting arm 17 extends from electronics housing 9 all the way through gap 16 to beyond the edge of the mounting and bus rail 4 so that mounting arm 17 can be secured directly to the wall 3 on the side of the mounting and bus rail 4 that faces away from busbars 7a-7d. The mounting arm 17 is secured using one or more screws 18 that engage in one or more openings 19 in the edge of the mounting arm 17 so that the heads of the screws 18 press mounting arm 17 against wall 3. Series modules 5a-c are mechanically secured directly to the wall in such a way that the mounting and bus rail is not responsible for this mechanical connection. The mounting and bus rail is used primarily for power transmission and optionally for signals or data transmission.

During installation, series modules 5a-c are preferably first anchored to wall 3 by screws.

Mounting and bus rail 4 with the angle brackets 12 preferably preassembled thereon (but with screws 14 only loosely connected therein) is then attached to series modules 5a-5c, so that the plug assemblies are placed in a contact position relative to the busbars 7a-d.

Screws 13 are then tightened to secure the arms 12a of angle brackets 12 to wall 3. At this point, the mounting and bus rail 4 is still able to move relative to the rear wall 3 since the screws 14 in the anchoring arms 12b have not yet been tightened. Mounting and bus rail 4 thereby rests centered on the plug assemblies 8.

Only then are screws 14 tightened, thereby fixing the mounting and bus rail 4 centered on plug assemblies 8. This form of anchoring allows an extensive tolerance compensation during mounting.

The supply of electrical power and optionally the transmission of signals from outside sources to the bus or its busbars 7a-d can be carried out in a variety of ways. For example, this can be accomplished simply with the aid of one or more cable terminals 20 which are screw-connected to a respective connecting lug 21, which is/are formed on mounting and bus rail 4, and which is/are each conductively connected to one or more of busbars 7a-d.

The mounting and bus rail 4 can easily be aligned in a variety of ways on a wall 3, for example on a vertically aligned wall 3, such that the series modules 5a, 5b, 5c, . . . are attached vertically from above as shown in FIG. 2 or from below as shown in FIG. 1. Also conceivable, however, is a horizontal alignment on vertically aligned mounting and bus rails 4 (not shown).

As described above, the mounting and bus rail 4 is configured such that the series modules 5a-5c can be attached to the mounting and bus rail 4 in direction Y, which extends perpendicular to row direction X and extends parallel to wall 3. FIGS. 1 to 4 also show that series modules 5 can be freely positioned in row direction X on mounting and bus rail 4. Series modules 5 can therefore have the same or different dimensions in this direction X and also in the other directions Y and Z. The system can thus be used in a particularly flexible manner. Open spaces on the sides of the series modules 5 and/or between series modules 5 attached to the mounting and bus rail 4 or ends of the mounting and bus rail and/or the cable terminals 21 can be covered with one or more covers 22, 23, 24 that are placed on the mounting and bus rail 4 in order to cover busbars 7 and/or connecting lugs 21 and cable terminals 20 in these sections. In this way, protection against contact can also easily be achieved for conductive components.

The invention claimed is:

1. A series module assembly adapted for mounting on a wall, comprising
    (a) a plurality of modules arranged in a row, each of said modules including at least one electronic component and a plug assembly connected with said at least one electronic component and extending from said module;
    (b) a bus assembly for mounting said plurality of modules on the wall, said bus assembly including a mounting and bus rail having a plurality of busbars, said plug assemblies of said plurality of modules being connected with said busbars to electrically connect said electronic components of said modules with said busbars, said modules being pre-assembled with said mounting and bus rail with said modules being arranged parallel to the wall; and
    c) a pair of adjustable anchoring assemblies which connect said mounting and bus rail with the wall at a selected distance, thereby to define a gap between said mounting and bus rail and the wall.

2. A series module assembly as defined in claim 1, wherein said bus assembly is spaced from the wall in a direction perpendicular to the direction of the row of modules and to the wall.

3. A series module assembly as defined in claim 1, wherein said mounting and bus rail includes a base formed of a non-conductive insulating material, said plurality of busbars being anchored within said base.

4. A series module assembly as defined in claim 3, wherein said base has a U-shaped cross-section including a base limb and a pair of longitudinal limbs perpendicular to said base limb to define a contact space, said plurality of busbars being arranged in said contact space.

5. A series module assembly as defined in claim 1, and further comprising a plurality of connectors for connecting said modules with the wall.

6. A series module assembly as defined in claim 1, wherein said pair of anchoring assemblies are connected with ends of said mounting and bus rail, respectively, said modules being arranged between said pair of anchoring assemblies.

7. A series module assembly as defined in claim 1, wherein at least a portion of said modules extend through said gap.

8. A series module assembly as defined in claim 7, wherein said module portion comprises a mounting bracket.

9. A series module assembly as defined in claim 7, and further comprising connectors which connect said module mounting brackets with the wall.

10. A series module assembly as defined in claim 1, wherein each of said anchoring assemblies comprises an angle bracket having a first anchoring arm connected with the wall and a second anchoring arm extending perpendicularly from said first anchoring arm and connected with said mounting and bus rail.

11. A series module assembly as defined in claim 10, wherein said mounting and bus rail is connected with said second anchoring arm and spaced from the wall.

12. A series module assembly as defined in claim 11, wherein said second anchoring arm contains a slot for receiving a screw for connecting said mounting and bus rail with said second anchoring arm, the position of said screw relative to said slot defining the selected distance of said mounting and bus rail from the wall.

13. A series module assembly adapted for mounting on a wall, comprising
    (a) a plurality of modules arranged in a row, each of said modules including at least one electronic component and a plug assembly connected with said at least one electronic component and extending from said module;
    (b) a bus assembly for mounting said plurality of modules on the wall, said bus assembly including a mounting and bus rail having a plurality of busbars, said plug assemblies of said plurality of modules being connected with said busbars to electrically connect said electronic components of said modules with said busbars, said modules being pre-assembled with said mounting and bus rail with said modules being arranged parallel to the wall, said bus assembly being adjustable to space said mounting and bus rail at a selected distance from the wall;
    (c) at least one cable terminal connected with a connecting lug of said mounting and bus rail and with at least one of the plurality of busbars to supply power to the series module assembly; and
    (d) covers for covering exposed areas of said mounting and bus rail, said modules, and said cable terminals.

* * * * *